(12) United States Patent
Takami et al.

(10) Patent No.: US 10,037,830 B2
(45) Date of Patent: Jul. 31, 2018

(54) INDIUM OXIDE TRANSPARENT CONDUCTIVE FILM

(71) Applicant: JX Nippon Mining & Metals Corporation, Tokyo (JP)

(72) Inventors: Hideo Takami, Ibaraki (JP); Masakatsu Ikisawa, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 0 days.

(21) Appl. No.: 15/416,013

(22) Filed: Jan. 26, 2017

(65) Prior Publication Data

US 2017/0133116 A1 May 11, 2017

Related U.S. Application Data

(62) Division of application No. 14/291,165, filed on May 30, 2014, now Pat. No. 9,589,695, which is a division of application No. 13/318,172, filed as application No. PCT/JP2010/067019 on Sep. 30, 2010, now Pat. No. 8,771,557.

(30) Foreign Application Priority Data

Oct. 6, 2009 (JP) ................................ 2009-232466

(51) Int. Cl.
| | |
|---|---|
| *H01B 1/08* | (2006.01) |
| *C23C 14/34* | (2006.01) |
| *C04B 35/00* | (2006.01) |
| *C04B 35/01* | (2006.01) |
| *C23C 14/08* | (2006.01) |
| *C04B 35/626* | (2006.01) |

(52) U.S. Cl.
CPC .............. *H01B 1/08* (2013.01); *C04B 35/01* (2013.01); *C04B 35/6261* (2013.01); *C04B 35/6263* (2013.01); *C04B 35/62695* (2013.01); *C23C 14/086* (2013.01); *C23C 14/34* (2013.01); *C23C 14/3414* (2013.01); *C04B 2235/3206* (2013.01); *C04B 2235/3208* (2013.01); *C04B 2235/3244* (2013.01); *C04B 2235/3248* (2013.01); *C04B 2235/3286* (2013.01); *C04B 2235/3293* (2013.01); *C04B 2235/5445* (2013.01); *C04B 2235/604* (2013.01); *C04B 2235/6567* (2013.01); *C04B 2235/6585* (2013.01); *C04B 2235/77* (2013.01); *C04B 2235/96* (2013.01); *C04B 2235/9653* (2013.01)

(58) Field of Classification Search
CPC .. H01B 1/00; H01B 1/08; C23C 28/04; H01L 31/022466
See application file for complete search history.

(56) References Cited

U.S. PATENT DOCUMENTS

| | | | |
|---|---|---|---|
| 8,277,694 B2 | 10/2012 | Ikasawa et al. | |
| 8,728,358 B2 | 5/2014 | Ikasawa et al. | |
| 2004/0180217 A1 | 9/2004 | Inoue et al. | |
| 2008/0308774 A1 | 12/2008 | Inoue et al. | |
| 2009/0211903 A1* | 8/2009 | Lee .................... | C23C 14/08 204/298.13 |
| 2009/0267029 A1 | 10/2009 | Takahashi et al. | |
| 2010/0140570 A1 | 6/2010 | Ikisawa et al. | |
| 2012/0199796 A1 | 8/2012 | Ikasawa et al. | |

FOREIGN PATENT DOCUMENTS

| | | |
|---|---|---|
| JP | 05-070942 A | 3/1993 |
| JP | 06-160876 A | 6/1994 |
| JP | 06-186576 A | 7/1994 |
| JP | 2002-226966 A | 8/2002 |
| JP | 2002-373527 A | 12/2002 |
| JP | 2003-105532 A | 4/2003 |
| JP | 2004-315951 A | 11/2004 |
| JP | 2007-273455 A | 10/2007 |
| JP | 2008-195554 A | 8/2008 |
| JP | 2014148752 * | 8/2014 |
| WO | 2005/103320 A1 | 2/2005 |
| WO | 2008/146693 A1 | 12/2008 |

OTHER PUBLICATIONS

T. Koida et al, English language Abstract of "Improved Near-infrared Transparency in Sputtered In2O3-based Transparent Conductive Oxide Thin Films by Zr-doping", Journal of Applied Physics 101, 063705, Mar. 23, 2007.
T.A. Gessert et al., "Sputtered In2O3 and ITO Thin Films Containing Zirconium", Journal of Applied Physics 105, 083547, Apr. 15, 2009.
T.A. Gessert et al., "TCO Thin Films with Permittivity Control", Materials Research Society Symp. Proc., vol. 1165, Apr. 2009.
T. Koida et al, "In2O3-based Transparent Conductive Oxide Films with High Electron Mobility", Journal of the Surface Science Society of Japan, vol. 29, No. 1, pp. 18-24, 2008 (month unknown).
H. Kim et al., "Transparent Conducting Zr-Doped In2O3 Thin Films for Organic Light-Emitting Diodes", Applied Physics Letters, vol. 78, No. 8, pp. 1050-1052, Feb. 2001.

* cited by examiner

*Primary Examiner* — Mark Kopec
(74) *Attorney, Agent, or Firm* — Howson & Howson LLP

(57) ABSTRACT

An indium oxide sintered compact containing zirconium as an additive, wherein the ratio of atomic concentration of zirconium to the sum of the atomic concentration of indium and the atomic concentration of zirconium is in the range of 0.5 to 4%, the relative density is 99.3% or higher, and the bulk resistance is 0.5 mΩ·cm or less. An indium oxide transparent conductive film of high transmittance in the visible light region and the infrared region, with low film resistivity, and in which the crystallization temperature can be controlled, as well as the manufacturing method thereof, and an oxide sintered compact for use in producing such transparent conductive film are provided.

3 Claims, No Drawings

INDIUM OXIDE TRANSPARENT CONDUCTIVE FILM

CROSS REFERENCE TO RELATED APPLICATIONS

This application is a divisional of U.S. application Ser. No. 14/291,165 (now U.S Pat. No. 9,589,695) filed on May 30, 2014 which is a divisional of U.S. application Ser. No. 13/318,172 (now U.S. Pat. No. 8,771,557) which is a 371 National Stage of International Application No. PCT/JP2010/067019, filed Sep. 30, 2010, which claims the benefit under 35 USC 119 of Japanese Application No. 2009-232466, filed Oct. 6, 2009.

BACKGROUND

The present invention relates to a transparent conductive film of high transmittance in the visible light region and the infrared region, with low film resistivity, and in which the crystallization temperature can be controlled, as well as the manufacturing method thereof, and an oxide sintered compact for use in producing such transparent conductive film.

As a transparent conductive film, tin-doped indium oxide (hereinafter referred to as "ITO") is being broadly used as an electrode material of an FPD (flat panel display) and the like since it possesses superior characteristics such as low resistivity and high transmittance.

Nevertheless, since ITO has a high carrier concentration and inferior transmittance in a long wavelength region, it is not necessarily effective as a transparent electrode for solar batteries which have been making remarkable progress in recent years. This is because, since the spectral sensitivity of solar batteries is up to approximately 1200 nm for crystalline silicon models and up to approximately 1300 nm for CIGS (Cu—In—Ga—Se-based) models, high transmittance is required up to this kind of long wavelength region.

Under the foregoing circumstances, zirconia-doped indium oxide (hereinafter referred to as "IZrO") has been proposed as a candidate material with high transmittance even in a long wavelength region and with low resistivity to replace ITO. Since IZrO has high mobility and low carrier concentration, it is attracting attention since the transmittance could be maintained relatively high even in a long wavelength region.

The following documents have reported findings related to IZrO. Japanese Patent Laid-open Publication No. H6-160876 describes zirconium-doped indium oxide. Nevertheless, the description is limited to presenting zirconium-doped indium oxide as a low resistivity material that can be substituted for ITO, and the additive to be added to indium oxide was merely switched from tin to zirconium. Although the Examples describe that the resistivity of the obtained film is extremely low, since the carrier mobility is extremely high at $10^{21}$ cm$^{-3}$, there is no choice but to say that the transmittance in the long wavelength region is extremely low and inferior as with ITO. Only one type of result is described regarding the zirconia concentration, and there is no description regarding an appropriate zirconia concentration. With respect to the substrate temperature during the deposition, the only descriptions that are provided are that annealing is performed at 220° C. after deposition at 250° C. and room temperature deposition, and there is no description concerning the crystallinity of the film. In addition, there is no technical concept of controlling the etching rate by using the crystallinity or controlling the crystallization temperature. Although Japanese Patent Laid-open Publication No. H6-160876 describes that the target used in the sputtering is of "high density", no description considering the specific value thereof is found. Furthermore, there is no description concerning the bulk resistance. With respect to the gas during sputtering which considerably affects the electrical properties of the film, it is only described as "mixed gas in which trace amounts of oxygen gas was added to argon gas."

Japanese Patent Laid-open Publication No. 2002-226966 and Japanese Patent Laid-open Publication No. 2002-373527 describe zirconium-doped indium oxide. Nevertheless, the resistivity of the amorphous film during the room temperature deposition is high, while there is no description concerning the resistivity of the film during the deposition at 200° C. Moreover, the concept of controlling the crystallization temperature of the film based on the type or concentration of the additive cannot be acknowledged. Although the density of the oxide sintered compact as the sputtering target is relatively high, the highest relative density that is described is 98.7%, and a target with even higher density is required in order to inhibit the nodules that are generated after prolonged sputtering.

Japanese Patent Laid-open Publication No. 2007-273455 describes that a zirconium-doped film having indium oxide as its main component yields superior electron mobility and specific resistance as an oxide transparent conductive film with high transmittance in the long wavelength region. Nevertheless, the substrate temperature in the Examples is extremely high at 650° C., or 450° C. at the lowest, but as a practical issue, there are significant restrictions in the actual use unless the substrate temperature is at least 300° C. or less. This is because there will be restrictions regarding the substrate material that can be used, and because it is necessary to appropriately maintain the electron concentration profile at the p-n interface of solar batteries. With respect to a zirconia-doped indium oxide target, there is no description concerning the properties such as the sintered compact density, the bulk resistance and the like. With respect to this point, it is assumed that the bulk resistance of the sintered compact that was used as the target was high since RF sputtering was adopted in the Examples rather than DC sputtering.

The Journal of the Surface Science Society of Japan, Vol. 29, No. 1, pages. 18-24, (2008) and the Journal of Applied Physics, Vol. 101, No. 063705, (2007) describe zirconia-added indium oxide. Nevertheless, the subject matter thereof shows that the substrate temperature is extremely high as with Japanese Patent Laid-open Publication No. 2007-273455, there is no description concerning the density of the sintered compact that was used as the target, and, as with Japanese Patent Laid-open Publication No. 2007-273455, RF sputtering is performed.

As described above, with respect to a zirconia-doped indium oxide sintered compact, an oxide sintered compact with sufficiently high density and low bulk resistance of a level required industrially did not exist to date. A scheme of controlling the crystallization temperature based on the type or concentration of the additive to enhance the etching rate of the film obtained by sputtering deposition using such oxide sintered compact as the sputtering target was not adopted.

SUMMARY

Thus, an object of this invention is to provide a transparent conductive film of high transmittance in the visible light region and the infrared region, with low film resistivity, and in which the crystallization temperature can be controlled, as well as the manufacturing method thereof, and an oxide sintered compact for use in producing such transparent conductive film.

As a result of intense study, the present inventors discovered that the resistivity can be reduced while maintaining high transmittance by adding zirconium of a predetermined atomic concentration to indium oxide, the density of the sintered compact can be increased by adding tin of a predetermined weight concentration, and the crystallization temperature of the film that is produced from the indium oxide sintered compact can be controlled by adding magnesium and/or calcium of a predetermined atomic concentration, and thereby completed this invention.

Based on the foregoing discovery, the present invention provides an indium oxide sintered compact containing zirconium as an additive, wherein the ratio of atomic concentration of zirconium to the sum of the atomic concentration of indium and zirconium is in the range of 0.5 to 4%, the relative density is 99.3% or higher, and the bulk resistance is 0.5 mΩ·cm or less. The indium oxide sintered compact may contain tin in addition to the additive, wherein the ratio of atomic concentration of tin to the sum of the atomic concentration of indium, zirconium and tin is in the range of 0.015 to 0.5%, the relative density is 99.5% or higher, and the bulk resistance is 0.5 mΩ·cm or less. The indium oxide sintered compact may contain magnesium and/or calcium in addition to the additive, wherein the ratio of atomic concentration of magnesium or calcium or the sum of the atomic concentrations thereof to the sum of the atomic concentration of all metal elements is in the range of 0.5 to 2.0%, the relative density is 99.5% or higher, and the bulk resistance is 0.5 mΩ·cm or less.

The present invention additionally provides an indium oxide transparent conductive film containing zirconium as an additive, wherein the ratio of atomic concentration of zirconium to the sum of the atomic concentration of indium and zirconium is in the range of 0.5 to 4%, the resistivity is $8 \times 10^{-4}$ Ω·cm or less, the electron mobility is 15 cm$^2$/V·s or more, the transmittance in a wavelength of 1200 nm is 85% or higher, and the indium oxide transparent conductive film is amorphous. The indium oxide transparent conductive film may contain tin in addition to the additive, wherein the ratio of atomic concentration of tin to the sum of the atomic concentration of indium, zirconium and tin is in the range of 0.015 to 0.5%, the resistivity is $8 \times 10^{-4}$ Ω·cm or less, the electron mobility is 15 cm$^2$/V·s or more, the transmittance in a wavelength of 1200 nm is 85% or higher, and the indium oxide transparent conductive film is amorphous. The indium oxide transparent conductive film may contain magnesium and/or calcium in addition to the additive, wherein the ratio of atomic concentration of magnesium or calcium or the sum of the atomic concentrations thereof to the sum of the atomic concentration of all metal elements is in the range of 0.5 to 2.0%, the resistivity is $8 \times 10^{-4}$ Ω·cm or less, the electron mobility is 15 cm$^2$/V·s or more, the transmittance in a wavelength of 1200 nm is 85% or higher, and the indium oxide transparent conductive film is amorphous. The crystallization temperature of the indium oxide transparent conductive film may be in a range of 150° C. to 260° C.

The present invention may additionally provide an indium oxide transparent conductive film containing zirconium as an additive, wherein the ratio of atomic concentration of zirconium to the sum of the atomic concentration of indium and the atomic concentration of zirconium is in the range of 0.5 to 4%, the resistivity is $4 \times 10^{-4}$ Ω·cm or less, the electron mobility is 50 cm$^2$/V·s or more, the transmittance in a wavelength of 1200 nm is 90% or higher, and the indium oxide transparent conductive film is crystalline. The indium oxide transparent conductive film may contain tin in addition to the additive, wherein the ratio of atomic concentration of tin to the sum of the atomic concentration of indium, zirconium and tin is in the range of 0.015 to 0.5%, the resistivity is $4 \times 10^{-4}$ Ω·cm or less, the electron mobility is 50 cm$^2$/V·s or more, the transmittance in a wavelength of 1200 nm is 90% or higher, and the indium oxide transparent conductive film is crystalline. The indium oxide transparent conductive film may contain magnesium and/or calcium in addition to the additive, wherein the ratio of atomic concentration of magnesium or calcium or the sum of the atomic concentrations thereof to the sum of the atomic concentration of all metal elements is in the range of 0.5 to 2.0%, the resistivity is $4 \times 10^4$ Ω·cm or less, the electron mobility is 50 cm$^2$/V·s or more, the transmittance in a wavelength of 1200 nm is 90% or higher, and the indium oxide transparent conductive film is crystalline.

The present invention may further provide a method of manufacturing an indium oxide transparent conductive film based on sputtering, wherein, in a mixed gas atmosphere of argon and oxygen in which the oxygen concentration is less than 1%, a substrate is retained without being heated or at 150° C. or less, and an oxide sintered compact as disclosed above is sputtered to deposit an amorphous film on the substrate. The present invention may provide a method of manufacturing an indium oxide transparent conductive film based on sputtering, wherein, in a mixed gas atmosphere of argon and oxygen in which the oxygen concentration is less than 1%, a substrate is retained without being heated or at 150° C. or less, an oxide sintered compact as disclosed above is sputtered to deposit an amorphous film on the substrate, the film is etched to form a circuit pattern, and the film is thereafter crystallized by being annealed at a temperature which is not lower than the crystallization temperature. Still further, the present invention may provide a method of manufacturing an indium oxide transparent conductive film based on sputtering, wherein, in a mixed gas atmosphere of argon and oxygen in which the oxygen concentration is less than 1%, a substrate is retained at a temperature which is not lower than the crystallization temperature, and an oxide sintered compact as disclosed above is sputtered to deposit the crystallized film on the substrate.

According to the present invention, since a high density sintered compact is provided, when this sintered compact is used as the sputtering target, superior effects are yielded in that it is possible to inhibit the generation of nodules on the target surface even after prolonged sputtering, and prevent the generation of abnormal discharge and particles in the sputtering process.

Moreover, with the film formed by sputtering the indium oxide sintered compact of the present invention, since the crystallization temperature can be controlled, a film formed at the intended crystallization temperature can be obtained. Since the overall film after sputtering deposition can be formed to be amorphous, such film is suitable for being etched without any residue, and is extremely effective as a transparent conductive film for use in solar batteries since the film is crystallized after annealing and will possess low resistivity.

DETAILED DESCRIPTION

The expression "ratio of the atomic concentration" as used in the present invention refers to the percentage of the atomic concentration of a specific element relative to the sum of the atomic concentration of a plurality of elements including the specific element. Here, the expression "plurality of elements" refers to indium and zirconium when the specific element is zirconium, refers to indium and zirconium and tin when the specific element is tin, and refers to all metal elements contained in the sintered compact when the specific element is magnesium and/or calcium.

Preferably, the ratio of atomic concentration of zirconium in the oxide sintered compact of the present invention to the sum of the atomic concentration of indium and the atomic concentration of zirconium is in the range of 0.5 to 4%. If the ratio of atomic concentration of zirconium is less than 0.5%, zirconium as the dopant for discharging the electrons and increasing the carrier concentration will decrease, and, therefore, the carrier concentration becomes insufficient, and the resistivity of the film produced with such an oxide sintered compact will increase. Meanwhile, if the ratio of atomic concentration of zirconium exceeds 4%, electrons are not discharged as the carrier from the doped zirconium, neutral impurity scattering will increase, and this causes high resistivity due to deterioration of mobility.

In the present invention, preferably, the ratio of atomic concentration of tin to the sum of the atomic concentration of indium, the atomic concentration of zirconium and the atomic concentration of tin is in the range of 0.015 to 0.5%. If the ratio of atomic concentration of tin is less than 0.015%, it is not possible to sufficiently increase the density of the indium oxide sintered compact. Meanwhile, if the atomic concentration of tin exceeds 0.5%, further improvement in the sintering density cannot be obtained, and transmittance in the long wavelength region will deteriorate since tin causes high carrier concentration.

In the present invention, preferably, the ratio of atomic concentration of magnesium to the sum of the atomic concentration of all metal elements is in the range of 0.5 to 2.0%. If the ratio of atomic concentration of magnesium is less than 0.5%, there will hardly be any effect of increasing the crystallization temperature; crystallized portions will arise in the film after sputtering deposition, which causes drawbacks in that such portion will remain as residue in the etching process. Meanwhile, if the ratio of atomic concentration of magnesium exceeds 2.0%, the crystallization temperature becomes too high and there are drawbacks in that the heating process will incur trouble of time and effort.

In the present invention, the preferable ratio of the atomic concentration of calcium is the same as magnesium, and calcium has the effect of being able to increase the crystallization temperature of the film as with magnesium. Accordingly, in addition to independently adding magnesium or calcium, the addition of both magnesium and calcium has the effect of increasing the crystallization temperature of the film. In this case also, the ratio of the total atomic concentration of magnesium and calcium should be the same as the range of the ratio of atomic concentration of magnesium described above.

As the method of manufacturing the amorphous film in the present invention, it is necessary to perform the sputtering deposition without heating the substrate or, even if it is heated, at a low temperature in which the film will not crystallize. This is because, if the substrate temperature is high, a part of the film after deposition will become crystallized. Moreover, as the type of atmosphere gas to be used during the sputtering, argon alone, or a mixed gas of argon and oxygen may be used. In the case of using mixed gas, the oxygen concentration is preferably 1% or less. This is because, if the oxygen concentration exceeds 1%, the resistivity of the film obtained by deposition will deteriorate, and the resistivity cannot be decreased even if annealing is subsequently performed, and the resistivity of the ultimately obtained film will become high.

The crystallized film in the present invention has low resistivity in comparison to an amorphous film due to the increase in mobility based on crystallization. As the method of crystallization, there is a method of annealing (heating) the amorphous film at a temperature that is higher than its crystallization temperature, and, if there is no etching process, a method of performing crystallization from the deposition stage while heating the substrate during deposition to a temperature in the vicinity of the crystallization temperature or higher.

The indium oxide sintered compact, amorphous indium oxide transparent conductive film and crystalline indium oxide transparent conductive film of the present invention can be prepared, for example, according to the following method.

Foremost, as the raw material powders, indium oxide ($In_2O_3$), zirconium oxide ($ZrO_2$), and, as needed, tin oxide ($SnO_2$), magnesium oxide (MgO), and calcium oxide (CaO) are used. Preferably, raw material powders with a specific surface area of roughly 10 $m^2$/g are used. This is because the grain size will increase if the specific surface area is small, and the density of the sintered compact cannot be sufficiently increased.

Subsequently, these raw material powders are weighed to achieve a predetermined concentration ratio, and then mixed. If the mixing is insufficient, the respective components become segregated in the sintered compact, and a high resistivity region and a low resistivity region will exist. In particular, since arcing (abnormal discharge) caused by the charge during the sputtering deposition will be generated in the high resistivity region, sufficient mixing is necessary in order to avoid such arcing.

For example, the raw material powders can be mixed with a super mixer in the atmosphere at a rotation speed of 2000 to 4000 rpm and rotation time of 3 to 5 minutes. Since the raw material powder is oxide, the atmosphere gas is not particularly required to prevent the oxidation of the raw material, and there is no need to use expensive gas such as argon, and there is no particular problem of performing the mixing in the atmosphere. As other mixing methods, a method of performing mixing for a long time using a ball mill can be adopted. Moreover, there is no particular problem in using other methods so as long as it is able to achieve the goal of uniformly mixing the raw material powders.

Pulverization is subsequently performed. Here, a calcination process may be added before pulverization, which can improve the sintering density. Pulverization is performed in order to uniformly disperse the respective compositions of the raw material powders in the sintered compact. If pulverization is not performed sufficiently, raw material powders of a large grain size will exist, there will be unevenness in the composition depending on the location, and this will cause an abnormal discharging during the sputtering deposition. Specifically, calcinated powder can be placed in an attritor together with zirconia beads, and pulverized at a rotation speed of 200 to 400 rpm and rotation time of 2 to 4 hours. Pulverization is desirably performed until the grain size of the raw material powder becomes 1 μm or less based on its average grain size (D50), and preferably 0.6 μm or less.

Granulation is subsequently performed. It is thereby possible to improve the fluidity of the raw material powder and improve the filled stated during the press molding. Granulation is performed upon adjusting the water volume so that the pulverized raw material becomes a slurry with a solid content of 40 to 60%. Here, preferably, the inlet temperature is set to 180 to 220° C. and the outlet temperature is set to 110 to 130° C.

Press molding is thereafter performed. The granulated powder can be press molded in the following conditions; namely, surface pressure of 400 to 800 kgf/cm² and retention time of 1 to 3 minutes. This is because, if the surface pressure is less than 400 kgf/cm², it is not possible to obtain a high density compact. Meanwhile, even if the surface pressure exceeds 800 kgf/cm², it is not possible to obtain higher density, and this is undesirable in terms of production since wasteful energy and costs are required.

Subsequently, molding is performed based on cold isostatic press (CIP) in the following conditions; namely, surface pressure of 1700 to 1900 kgf/cm² and retention time of 1 to 3 minutes, and sintering is thereafter performed using an electric furnace in an oxygen atmosphere at 1400 to 1600° C. for 10 to 30 hours. An oxide sintered compact can thereby be produced.

With respect to the density of the sintered compact, the relative density can be obtained by measuring the density with the Archimedian method and thereafter dividing it by the theoretical density. Moreover, the bulk resistance of the sintered compact can be measured with the four-terminal method.

Next, the obtained sintered compact can be processed into a sputtering target of a predetermined shape based on grinding or the like. Subsequently, by performing sputtering deposition to the obtained sputtering target in an argon atmosphere under pressure of 0.5 Pa, especially without heating the glass substrate, an amorphous transparent conductive film can be obtained.

This amorphous conductive film can be annealed in a nitrogen atmosphere at 200 to 300° C. for approximately 1 hour. This is because the amorphous transparent conductive film becomes crystallized and a crystalline transparent conductive film can thereby be obtained.

The resistivity and mobility of the film can be obtained based on Hall measurement. Moreover, the transmittance can be measured with a spectral transmissometer. The crystallization temperature of the film can be decided upon retaining the film in a nitrogen atmosphere for 1 hour in 5° C. intervals from 150° C., thereafter removing the film, and observing the existence of the XRD diffraction peak of the film and the decrease in the resistivity of the film. The temperature where the XRD diffraction peak appeared and the resistivity declined sharply was used as the crystallization temperature. Measurement of the resistivity and mobility after annealing was obtained by performing Hall measurement to the film that was subject to annealing in a nitrogen atmosphere for 1 hour at a temperature that was 30° C. higher than the crystallization temperature that was decided as described above.

EXAMPLES

Example 1

Indium oxide ($In_2O_3$) raw material powder and zirconium oxide ($ZrO_2$) raw material powder with an average grain size of approximately 2.0 µm were weighed so that the ratio of atomic concentration of zirconium to the sum of the atomic concentration of indium and the atomic concentration of zirconium becomes 1%, and these raw material powders were mixed with a super mixer in the atmosphere at a rotation speed of 3000 rpm and rotation time of 3 minutes. The mixed powder was placed in an attritor together with zirconia beads and pulverized at a rotation speed of 300 rpm and rotation time of 3 hours to achieve an average grain size (D50) of 0.8 µm. The water volume was adjusted so that the pulverized raw material became a slurry with a solid content of 50%, and granulation was performed by setting the inlet temperature to 200° C. and the outlet temperature to 120° C. In addition, the granulated powder was press molded in the following conditions; namely, surface pressure of 600 kgf/cm² and retention time of 1 minute, and thereafter molded based on cold isostatic press (CIP) in the following conditions; namely, surface pressure of 1800 kgf/cm² and retention time of 1 minute. Thereafter, the molded article was sintered using an electric furnace in an oxygen atmosphere at 1550° C. for 20 hours. The relative density of the obtained sintered compact was 99.3%, and the bulk resistance was 0.47 mΩ·cm.

This sintered compact was ground to a disk shape with a diameter of 6 inches and a thickness of 6 mm, and thereby processed into a sputtering target. This target was placed in a sputtering device and deposited, via sputtering, on a non-heated glass substrate in an argon atmosphere at a pressure of 0.5 Pa in order to obtain an amorphous transparent conductive film. As a result of subjecting this film to Hall measurement, the resistivity was 0.765 mΩ·cm, the mobility was 15.2 cm²/V·s, and it was confirmed that the film was amorphous since an XRD diffraction peak could not be acknowledged. Here, the transmittance of the film was 86.7% in a wavelength of 1200 nm.

The obtained amorphous transparent conductive film was annealed in a nitrogen atmosphere for 1 hour, and, upon subjecting the film to Hall measurement and XRD diffraction measurement, since the sharp decline in the resistivity of the film and appearance of the XRD diffraction peak were acknowledged when the heating temperature was 155° C., the crystallization temperature of this film was recognized as being 155° C.

Upon subsequently annealing this film at 185° C., which is a temperature that is 30° C. higher than the crystallization temperature and subjecting the film to Hall measurement, the resistivity was 0.395 mΩ·cm, the mobility was 68.5 cm²/V·s, and the transmittance in a wavelength of 1200 nm was 92.1%.

| Examples | Ratio of Zr Atomic Concentration (%) | Ratio of Sn Atomic Concentration (%) | Ratio of Mg Atomic Concentration (%) | Ratio of Ca Atomic Concentration (%) | Relative Density (%) | Bulk Resistance (mΩcm) | Oxygen Concentration (%) | Resistivity after Deposition (mΩcm) | Film Mobility after Deposition (cm2/Vs) | Crystallization Temperature (° C.) | Permeability after Deposition (at 1200 nm) (%) | Resistivity after Annealing (mΩcm) | Film Mobility after Annealing (cm2/Vs) | Permeability after Annealing (at 1200 nm) (%) |
|---|---|---|---|---|---|---|---|---|---|---|---|---|---|---|
| Example 1 | 1 | 0 | 0 | 0 | 99.3 | 0.47 | 0 | 0.765 | 15.2 | 155 | 86.7 | 0.395 | 68.5 | 92.1 |
| Example 2 | 2 | 0 | 0 | 0 | 99.4 | 0.45 | 0 | 0.748 | 16.0 | 160 | 87.7 | 0.385 | 64.6 | 93.1 |
| Example 3 | 3 | 0 | 0 | 0 | 99.5 | 0.46 | 0 | 0.590 | 23.6 | 170 | 87.1 | 0.321 | 70.1 | 93.0 |

-continued

| Examples | Ratio of Zr Atomic Concentration (%) | Ratio of Sn Atomic Concentration (%) | Ratio of Mg Atomic Concentration (%) | Ratio of Ca Atomic Concentration (%) | Relative Density (%) | Bulk Resistance (mΩcm) | Oxygen Concentration (%) | Resistivity after Deposition (mΩcm) | Film Mobility after Deposition (cm2/Vs) | Crystallization Temperature (° C.) | Permeability after Deposition (at 1200 nm) (%) | Resistivity after Annealing (mΩcm) | Film Mobility after Annealing (cm2/Vs) | Permeability after Annealing (at 1200 nm) (%) |
|---|---|---|---|---|---|---|---|---|---|---|---|---|---|---|
| Example 4 | 4 | 0 | 0 | 0 | 99.4 | 0.48 | 0 | 0.675 | 20.0 | 170 | 87.3 | 0.365 | 55.2 | 92.8 |
| Comparative Example 1 | 0.3 | 0 | 0 | 0 | 98.3 | 0.48 | 0 | 0.855 | 13.7 | 150 | 86.5 | 0.523 | 48.2 | 91.3 |
| Comparative Example 2 | 5 | 0 | 0 | 0 | 98.6 | 0.49 | 0 | 0.896 | 12.1 | 180 | 86.9 | 0.612 | 44.6 | 91.5 |
| Example 5 | 2 | 0.02 | 0 | 0 | 99.7 | 0.43 | 0 | 0.747 | 15.8 | 160 | 87.7 | 0.388 | 64.2 | 93.2 |
| Example 6 | 2 | 0.12 | 0 | 0 | 99.8 | 0.44 | 0 | 0.741 | 16.2 | 160 | 87.6 | 0.381 | 64.7 | 93.1 |
| Example 7 | 2 | 0.23 | 0 | 0 | 99.8 | 0.43 | 0 | 0.745 | 15.7 | 160 | 87.8 | 0.378 | 64.1 | 93.1 |
| Example 8 | 2 | 0.47 | 0 | 0 | 99.9 | 0.43 | 0 | 0.732 | 16.0 | 160 | 87.7 | 0.387 | 64.9 | 93.2 |
| Comparative Example 3 | 2 | 0.7 | 0 | 0 | 99.9 | 0.44 | 0 | 0.722 | 15.5 | 160 | 87.7 | 0.371 | 64.7 | 93.1 |
| Example 9 | 2 | 0.12 | 0.5 | 0 | 99.7 | 0.44 | 0 | 0.739 | 16.5 | 180 | 87.6 | 0.381 | 67.2 | 93.1 |
| Example 10 | 2 | 0.12 | 1.0 | 0 | 99.8 | 0.44 | 0 | 0.740 | 16.7 | 205 | 87.3 | 0.383 | 65.3 | 93.3 |
| Example 11 | 2 | 0.12 | 1.5 | 0 | 99.7 | 0.45 | 0 | 0.759 | 16.3 | 220 | 87.5 | 0.385 | 64.1 | 93.2 |
| Example 12 | 2 | 0.12 | 2.0 | 0 | 99.8 | 0.46 | 0 | 0.765 | 15.5 | 245 | 87.7 | 0.391 | 62.2 | 93.3 |
| Example 13 | 2 | 0.12 | 0 | 0.5 | 99.7 | 0.44 | 0 | 0.739 | 16.2 | 185 | 87.8 | 0.379 | 67.1 | 93.4 |
| Example 14 | 2 | 0.12 | 0 | 1.0 | 99.6 | 0.44 | 0 | 0.742 | 16.1 | 210 | 87.4 | 0.381 | 65.3 | 93.0 |
| Example 15 | 2 | 0.12 | 0 | 1.5 | 99.7 | 0.45 | 0 | 0.755 | 16.3 | 230 | 87.5 | 0.385 | 63.5 | 93.2 |
| Example 16 | 2 | 0.12 | 0 | 2.0 | 98.8 | 0.46 | 0 | 0.765 | 15.5 | 255 | 87.6 | 0.398 | 61.3 | 93.2 |
| Example 17 | 2 | 0.12 | 0.25 | 0.25 | 99.8 | 0.44 | 0 | 0.740 | 16.4 | 185 | 87.4 | 0.385 | 66.8 | 93.3 |
| Example 18 | 2 | 0.12 | 0.5 | 0.5 | 99.7 | 0.44 | 0 | 0.746 | 16.2 | 210 | 87.5 | 0.388 | 64.8 | 93.4 |
| Example 19 | 2 | 0.12 | 0.75 | 0.75 | 99.8 | 0.45 | 0 | 0.761 | 15.9 | 230 | 87.6 | 0.392 | 64.1 | 93.3 |
| Example 20 | 2 | 0.12 | 1 | 1 | 99.9 | 0.46 | 0 | 0.778 | 15.7 | 255 | 87.6 | 0.396 | 61.5 | 93.2 |
| Comparative Example 4 | 2 | 0.12 | 3 | 0 | 99.6 | 0.47 | 0 | 0.789 | 15.2 | 285 | 87.8 | 0.388 | 60.3 | 93.1 |
| Comparative Example 5 | 2 | 0.12 | 0 | 3 | 99.6 | 0.47 | 0 | 0.791 | 15.3 | 300 | 87.5 | 0.392 | 59.6 | 93.0 |
| Comparative Example 6 | 2 | 0.12 | 1.5 | 1.5 | 99.6 | 0.47 | 0 | 0.782 | 15.2 | 290 | 87.6 | 0.393 | 60.2 | 93.0 |
| Comparative Example 7 | 2 | 0.12 | 0 | 0 | 99.8 | 0.44 | 1 | 0.838 | 11.1 | 160 | 87.3 | 0.773 | 40.3 | 90.3 |
| Comparative Example 8 | 0 | 10 | 0 | 0 | 99.9 | 0.22 | 0 | 0.745 | 8.6 | 160 | 71.3 | 0.320 | 15.3 | 69.0 |
| Comparative Example 9 | 0 | 10 | 0 | 0 | 99.9 | 0.22 | 1 | 0.820 | 9.1 | 160 | 79.0 | 0.290 | 17.1 | 73.0 |
| Comparative Example 10 | 2 | 0 | 0 | 0 | 93.2 | 0.87 | 0 | 1.375 | 4.6 | 165 | 83.2 | 0.786 | 9.2 | 84.3 |
| Comparative Example 11 | 2 | 0.12 | 0 | 0 | 91.2 | 0.91 | 0 | 1.567 | 3.7 | 165 | 79.8 | 0.832 | 8.7 | 82.1 |

Examples 2 to 4, Comparative Examples 1 and 2

The manufacturing method of the sintered compact and the transparent conductive film were the same as Example 1, and only the ratio of atomic concentration of zirconium was changed. The results are shown in Table 1. From these results, it is evident that, when the ratio of atomic concentration of zirconium falls outside of the range of 0.5 to 4%, the resistivity of the film becomes high after sputtering deposition and after annealing and the mobility becomes low, which shows undesirable characteristics as a transparent conductive film. Moreover, even in cases where tin is not added, the relative density is 99.3% or higher, and even 99.5% or higher, and it is evident that high density has been obtained.

Examples 5 to 8, Comparative Example 3

The manufacturing method of the sintered compact and the manufacturing method of the transparent conductive film were the same as Example 1, the ratio of atomic concentration of zirconium was set to 2%, and only the ratio of atomic concentration of tin was changed. The results are shown in Table 1. From these results, it is evident that the relative density is comparatively high at 99.3% even in cases where the tin concentration was zero as in Example 1, but as a result of adding tin, the relative density became 99.5% or higher, and even 99.7% or higher, and it was possible to achieve even higher density. Meanwhile, it can be seen that the improvement in the density becomes saturated when the ratio of atomic concentration of tin is 0.5% or higher.

Examples 9 to 20, Reference Examples 4 to 6

The manufacturing method of the sintered compact and the manufacturing method of the transparent conductive film were the same as Example 1, the ratio of atomic concentration of zirconium was set to 2%, the ratio of atomic concentration of tin was set to 0.12%, and the ratio of atomic concentration of magnesium or the ratio of atomic concentration of calcium was changed. The results are shown in Table 1. From these results, it is evident that, by adding these elements, the crystallization temperature can be increased. Meanwhile, when the concentration of these elements exceeds 2.0%, it can be seen that the crystallization temperature becomes too high and this is undesirable.

Reference Example 7

The manufacturing method of the sintered compact and the manufacturing method of the transparent conductive film were the same as Example 1, the ratio of atomic concentration of zirconium was set to 2%, the ratio of atomic concentration of tin was set to 0.12%, magnesium and the like were not added, and the atmosphere gas during sputtering was 1% oxygen. The results are shown in Table 1. From these results, it is evident that, if the oxygen concentration is high, the resistivity of the film after deposition and after crystallization becomes high and the mobility becomes low.

Comparative Examples 8 and 9

The manufacturing method of the sintered compact and the manufacturing method of the transparent conductive film were the same as Example 1, and the indium oxide raw material powder and the tin oxide raw material powder were used, and the additive amount of the tin oxide raw material powder was set to be comparable to a standard ITO. In Comparative Example 8, the oxygen concentration during the sputtering deposition was set to 0%, and, in Comparative Example 9, the oxygen concentration during the sputtering deposition was set to 1%. The results of the sintered compact and film characteristics are as described in Table 1. From these results, it can be seen that ITO has high carrier concentration and low transmittance in a long wavelength (1200 nm) since the mobility is low in cases of equivalent resistivity when compared with the present invention.

Comparative Examples 10 and 11

The manufacturing method of the sintered compact and the transparent conductive film were the same as Example 1, and the sintering temperature was set to 1350° C. In Comparative Example 10, the ratio of atomic concentration of zirconium was set to 2%, and, in Comparative Example 11, the ratio of atomic concentration of zirconium was set to 2% and the ratio of atomic concentration of tin was set to 0.12%. The results of the sintered compact and film characteristics are as described in Table 1. From these results, it can be seen that a film obtained based on sputtering deposition from a sintered compact with a low relative density and high bulk resistance by lowering the sintering temperature has high resistivity and low transmittance in a long wavelength (1200 nm), and is undesirable.

Since the indium oxide sintered compact of the present invention has high density, it is possible to inhibit the generation of nodules on its surface and prevent abnormal discharge in the sputtering process when this sintered compact is used as the sputtering target. Moreover, since the indium oxide sintered compact of the present invention has low bulk resistivity, it is possible to reduce the resistivity of the film formed by sputtering, and this is effective in faulting a transparent conductive film. In addition, since the indium oxide transparent conductive film of the present invention has high transmittance in the visible light region and the infrared region, as well as high electron mobility and low film resistivity, it is extremely effective as a transparent conductive film for use in solar batteries.

We claim:

1. An indium oxide transparent conductive film containing zirconium as an additive, wherein a ratio of atomic concentration of zirconium to a sum of that of indium and zirconium is in a range of 0.5 to 4%, resistivity is $4 \times 10^{-4} \Omega \cdot cm$ or less, electron mobility is 50 $cm^2/V \cdot s$ or more, transmittance in a wavelength of 1200 nm is 90% or higher, and the indium oxide transparent conductive film is crystalline.

2. An indium oxide transparent conductive film containing zirconium as an additive and tin in addition to the additive, wherein a ratio of atomic concentration of zirconium to a sum of that of indium and zirconium is in a range of 0.5 to 4%, a ratio of atomic concentration of tin to a sum of that of indium, zirconium and tin is in a range of 0.015 to 0.5%, resistivity is $4 \times 10^{-4} \Omega \cdot cm$ or less, electron mobility is 50 $cm^2/V \cdot s$ or more, transmittance in a wavelength of 1200 nm is 90% or higher, and the indium oxide transparent conductive film is crystalline.

3. The indium oxide transparent conductive film according to claim 2 containing at least one of magnesium and calcium in addition to the additive, wherein a ratio of atomic concentration of magnesium or calcium or a sum of the atomic concentrations thereof to a sum of that of all metal elements of the film is in the range of 0.5 to 2.0%, the resistivity is $4 \times 10^{-4} \Omega \cdot cm$ or less, the electron mobility is 50 $cm^2/V \cdot s$ or more, the transmittance in a wavelength of 1200 nm is 90% or higher, and the indium oxide transparent conductive film is crystalline.

* * * * *